(12) United States Patent
Li et al.

(10) Patent No.: US 9,563,371 B2
(45) Date of Patent: Feb. 7, 2017

(54) SELF-ADJUSTING PHASE CHANGE MEMORY STORAGE MODULE

(71) Applicant: GLOBALFOUNDREIS INC., Grand Cayman (KY)

(72) Inventors: Jing Li, Ossining, NY (US); Dinesh C. Verma, New Castle, NY (US)

(73) Assignee: GLOBALFOUNDREIS INC., Grand Cayman (KY)

( * ) Notice: Subject to any disclaimer, the term of this patent is extended or adjusted under 35 U.S.C. 154(b) by 440 days.

(21) Appl. No.: 13/952,279

(22) Filed: Jul. 26, 2013

(65) Prior Publication Data
US 2015/0032979 A1  Jan. 29, 2015

(51) Int. Cl.
*G06F 3/06* (2006.01)
*G11C 11/56* (2006.01)
*G11C 13/00* (2006.01)

(52) U.S. Cl.
CPC ........... *G06F 3/0617* (2013.01); *G06F 3/0608* (2013.01); *G06F 3/0632* (2013.01); *G06F 3/0634* (2013.01);
(Continued)

(58) Field of Classification Search
CPC ...... G06F 3/0679; G06F 3/0644; G06F 3/064; G06F 3/0634; G06F 3/0608; G06F 3/065; G06F 3/0614; G06F 3/0683; G06F 12/0238; G06F 12/0246; G11C 13/0004; G11C 11/5678; G11C 2211/5641
See application file for complete search history.

(56) References Cited

U.S. PATENT DOCUMENTS 6,145,066 A * 11/2000 Atkin ............... G06F 3/0605
                                                          709/208
6,426,891 B1   7/2002 Katori
(Continued)

FOREIGN PATENT DOCUMENTS

CN       101833992        9/2010
EP       0 626 758 A2    11/1994

OTHER PUBLICATIONS

G.W. Burr et al., "Phase change memory technology," Journal of Vacuum Science & Technology B: Microelectronics and Nanometer Structures, vol. 28, No. 2, Mar./Apr. 2010, pp. 223-262.
(Continued)

*Primary Examiner* — Michael Krofcheck
(74) *Attorney, Agent, or Firm* — Scully Scott Murphy and Presser (57) ABSTRACT

A dynamic self-adjusting memory storage device and method of operating. The device includes a plurality of adjustable-size phase change memory (PCM) storage sub-modules connected to and communicating over a bus with a control device. One of the plurality of adjustable-size memory storage sub-modules is in a stand-by mode of operation. The control device implements steps to: determine, based on a switching criteria, when the memory storage device needs to be switched to a different operation mode; select one or more adjustable-sized memory storage sub-modules for switching to said different operation mode; copy stored data from a selected actively operating adjustable-size memory storage sub-module to said adjustable-size memory storage sub-module in said stand-by mode; and change the capacity of the selected actively operating adjustable-size memory storage sub-module after the copying. The dynamic self-adjusting memory capacity method is per-
(Continued)

formed without powering down the memory storage device or paying any timing penalty.

14 Claims, 4 Drawing Sheets

(52) U.S. Cl.
CPC ........... *G06F 3/0644* (2013.01); *G06F 3/0679* (2013.01); *G06F 3/0688* (2013.01); *G11C 11/5678* (2013.01); *G11C 13/0004* (2013.01)

(56) References Cited

U.S. PATENT DOCUMENTS

| | | | |
|---|---|---|---|
| 6,914,801 | B2 | 7/2005 | Kostylev et al. |
| 7,332,735 | B2 | 2/2008 | Campbell |
| 7,359,246 | B2 | 4/2008 | Sforzin et al. |
| 7,391,642 | B2 | 6/2008 | Gordon et al. |
| 7,417,900 | B2 | 8/2008 | Rolandi et al. |
| 7,420,851 | B2 | 9/2008 | Fasoli |
| 7,423,897 | B2 | 9/2008 | Wicker |
| 7,486,536 | B2 | 2/2009 | Kim et al. |
| 7,499,315 | B2 | 3/2009 | Lowrey et al. |
| 7,515,459 | B2 | 4/2009 | Kang et al. |
| 7,554,861 | B2 | 6/2009 | Vimercati et al. |
| 7,567,473 | B2 | 7/2009 | Breitwisch et al. |
| 7,602,632 | B2 | 10/2009 | Breitwisch et al. |
| 7,606,055 | B2 | 10/2009 | Liu |
| 7,626,858 | B2 | 12/2009 | Happ et al. |
| 7,656,710 | B1 | 2/2010 | Wong |
| 7,660,147 | B2 | 2/2010 | Chao et al. |
| 7,663,137 | B2 | 2/2010 | Campbell |
| 7,663,618 | B2 | 2/2010 | Svensson et al. |
| 7,684,227 | B2 | 3/2010 | Liu et al. |
| 7,696,077 | B2 | 4/2010 | Liu |
| 7,729,163 | B2 | 6/2010 | Ramani et al. |
| 7,745,231 | B2 | 6/2010 | Liu et al. |
| 7,754,522 | B2 | 7/2010 | Liu |
| 7,755,939 | B2 | 7/2010 | Tamada |
| 7,796,424 | B2 | 9/2010 | Happ et al. |
| 7,817,475 | B2 | 10/2010 | Lowrey |
| 7,929,338 | B2 | 4/2011 | Franceschini et al. |
| 2003/0167372 | A1* | 9/2003 | Lee .................... G11C 29/808 711/103 |
| 2007/0002619 | A1* | 1/2007 | Schoenauer ......... G11C 14/009 365/185.08 |
| 2007/0029537 | A1 | 2/2007 | Campbell |
| 2007/0034905 | A1 | 2/2007 | Elkins |
| 2007/0121364 | A1 | 5/2007 | Bertin et al. |
| 2007/0158631 | A1 | 7/2007 | Daley et al. |
| 2007/0268742 | A1 | 11/2007 | Liu |
| 2008/0014733 | A1 | 1/2008 | Liu |
| 2008/0044632 | A1 | 2/2008 | Liu et al. |
| 2008/0062752 | A1 | 3/2008 | Giovinazzi et al. |
| 2008/0112238 | A1* | 5/2008 | Kim .................... G11C 11/5621 365/200 |
| 2008/0142773 | A1 | 6/2008 | Campbell |
| 2008/0258125 | A1 | 10/2008 | Liu et al. |
| 2008/0298113 | A1 | 12/2008 | Liu et al. |
| 2008/0298114 | A1 | 12/2008 | Liu et al. |
| 2009/0049234 | A1* | 2/2009 | Oh ..................... G06F 12/0246 711/103 |
| 2009/0196095 | A1 | 8/2009 | Liu |
| 2009/0213653 | A1 | 8/2009 | Perlmutter et al. |
| 2009/0244961 | A1 | 10/2009 | Ramani et al. |
| 2009/0303785 | A1 | 12/2009 | Hwang et al. |
| 2010/0008163 | A1 | 1/2010 | Liu |
| 2010/0020594 | A1 | 1/2010 | De Sandre et al. |
| 2010/0028421 | A1 | 2/2010 | Cumming et al. |
| 2010/0034016 | A1 | 2/2010 | Liu |
| 2010/0110779 | A1 | 5/2010 | Liu et al. |
| 2010/0122016 | A1* | 5/2010 | Marotta ................. G11C 16/16 711/103 |
| 2010/0144087 | A1 | 6/2010 | Ha et al. |
| 2010/0153631 | A1* | 6/2010 | Moon .................. G06F 12/0246 711/103 |
| 2010/0214830 | A1 | 8/2010 | Franceschini et al. |
| 2010/0283029 | A1 | 11/2010 | Dennison et al. |
| 2011/0063902 | A1 | 3/2011 | Lung |
| 2011/0252215 | A1* | 10/2011 | Franceschini ....... G11C 11/5678 711/170 |
| 2011/0292749 | A1 | 12/2011 | Park |
| 2011/0305074 | A1 | 12/2011 | Lung |
| 2012/0005512 | A1* | 1/2012 | Chew .................... G06F 1/3203 713/324 |
| 2012/0051123 | A1 | 3/2012 | Liu |
| 2012/0248399 | A1 | 10/2012 | Sasago et al. |
| 2013/0107625 | A1* | 5/2013 | Yang .................. G11C 11/5628 365/185.03 |

OTHER PUBLICATIONS

S. Kostylev et al., "Drift of programmed resistance in electrical phase change memory devices, " Proc. E*PCOS 2008, Prague, 2008, pp. 17-124.

D.H. Kang et al., "Two-bit Cell Operation in Diode-Switch Phase Change Memory Cells with 90nm Technology," Symposium on VLSI Technology, 2008, pp. 98099.

Y.H. Chiu et al., "Impact of Resistance Drift on Multilevel PCM Design," IC Design and Technology, ICICDT, 2010, pp. 20-23.

Liu et al., "Pass-transistor adiabatic logic with NMOS pull-down configureation" [online] Electronics Letters Apr. 16, 1998, vol. 34, No. 8 [retrieved on Jan. 16, 2013 (Jan. 16, 2013)] Retrieved from the internet <URL:http://ieeexplore.ieee.org.proxy.mul.missouri.edu/epl/articleDetails.jsp? reload=true&tp=&amumer=674890&contentType=Journals+%26+Magazines&matchBoolean%3Dtrue%26searchField%3DSearch_All_Text%26queryText%3D%28p_Title%3APass-transistor+adiabatic+logic+with+NMOS.

* cited by examiner

SELF-ADJUSTING PHASE CHANGE MEMORY STORAGE MODULE

FIELD

The present disclosure relates to memory storage systems and configurations of memory storage devices, and particularly, a novel phase change memory (PCM) storage system of self-adjusting capacity.

BACKGROUND

Modern computer systems rely on different types of storage, such as memory systems, disk systems etc. In the current state of the art, these systems come with a fixed capacity, e.g., a memory module may have the size of 1 GB, or a disk may have the size of 1 TB. The size of the storage module can generally not be changed once the system that is using the memory is running.

With the growth in memory storage device technologies such as PCM, one can create storage modules which can be put into one or more modes, where different modes can have different capacity. However, such modules in the current state of the art do not exist. For example, the SLC or MLC modes of commercially available NAND flash are designed as part of the product feature. Meaning thereby customers either buy SLC NAND or MLC NAND products off the shelf and do not have the flexibility of changing the mode. This means that system architect need to estimate the best mode (i.e., capacity) before the system is put into actual operation and the mode cannot be changed during the operation since storage systems currently do not have re-configurability.

These early estimates can sometimes be incorrect, i.e., hard to predict the new workloads since they are evolving over time. In order to adapt system to emerging workloads in a wider application space, it is desirable to have a storage module which can adjust its mode dynamically to provide for more storage and flexibility during the operation of the system. At a minimum, we would like to be able to adjust the capacity of the memory system in offline mode by powering it down and repowering it again for mode switching.

BRIEF SUMMARY

A self-adjusting memory storage system and method, the memory of said storage system whose bit storage capacity is configurable.

In one embodiment, the memory is of a PCM material.

The self-adjusting phase change memory storage system and method dynamically aggregates two or more PCM storage modules into a single PCM storage device of increased capacity.

The dynamic self-adjusting phase change memory storage system and method can increase its size while active and operational without either shutting down the system or introducing any timing penalty.

In one aspect, there is provided a method for dynamically self-adjusting a capacity of a memory storage device having a plurality of adjustable-size memory storage sub-modules. The method comprises: providing one of the plurality of adjustable-size memory storage sub-modules in a stand-by mode of operation; determining, based on a switching criteria, when the memory storage device needs to be switched to a different operation mode; selecting one or more adjustable-sized memory storage sub-modules for switching to the different operation mode; copying stored data from a selected actively operating adjustable-size memory storage sub-module to the adjustable-size memory storage sub-module in the stand-by mode; and changing the capacity of the selected actively operating adjustable-size memory storage sub-module after the copying according to the different operation mode, wherein a programmed control device associated with the memory storage device performs the determining and selecting and initiates the copying and the capacity changing.

In a further aspect, there is provided a dynamic self-adjusting memory storage system. The system comprises: a plurality of adjustable-size memory storage sub-modules, at least one of the plurality of adjustable-size memory storage sub-modules in a stand-by mode of operation; a programmed control device, coupled to a memory, and communicating with the plurality of adjustable-size memory storage sub-modules over a bus, the control device configured to: determine, based on a switching criteria, when the memory storage device needs to be switched to a different operation mode; select one or more adjustable-sized memory storage sub-modules for switching to the different operation mode; copy stored data from a selected actively operating adjustable-size memory storage sub-module to the adjustable-size memory storage sub-module in the stand-by mode; and change the capacity of the selected actively operating adjustable-size memory storage sub-module after the copying according to the different operation mode.

BRIEF DESCRIPTION OF THE DRAWINGS

These and other objects, features and advantages of the present invention will become apparent from the following detailed description of illustrative embodiments thereof, which is to be read in connection with the accompanying drawings, in which.

DETAILED DESCRIPTION

A memory storage system and method of operating is provided that can adjust its capacity dynamically. The memory technology may be any which allows the memory to operate in modes of different capacity.

For example, in many systems, it may be desirable to have a memory storage "module" whose size can be adjusted dynamically at run time. As an example, a network packet analyzer may nominally store data for only a couple of hours worth of traffic. However, on some rare occasions, it may need to store data for more hours, e.g. when its connection to the network operation control has been down for some time. In those cases, it would be beneficial for the network packet analyzer to increase the capacity of its storage module at or near real-time (on the fly).

Recent advances in memory technologies, such as phase change memory (PCM), allow a memory module to be designed to operate in multiple modes. Applicants refer to a commonly-owned, co-pending U.S. patent application Ser. No. 13/335,310 entitled PARALLEL PROGRAMMING SCHEME IN MULTI-BIT PHASE CHANGE MEMORY for an exemplary multi-bit PCM programming technique. Thus, for purposes of description, the memory storage system described herein below refers to PCM memory technology providing a capability of being configured to operate in different capacity sizes. That is, as known, it is possible to configure each phase change memory cell that makes up the memory to store either 1 bit, 2 bits or 4 bits. The choice of how many bits chosen determines the mode and the ensuing capacity. Thus, as an example, a single PCM module with a nominal capacity of 1 GB can be configured to operate with a capacity of 2 GB or 4 GB. The effective throughput and read/write-times of the modules are different in different modes. Each storage capacity configuration corresponds to a "mode" of the module or sub-module.

To switch its mode, one option could be to start a transition process when the memory is powered up.

In a further embodiment, the adjustable PCM memory storage module is configurable to a different storage capacity dynamically during live operation. It further changes the mode on the fly without introducing performance penalty.

Figure 1:
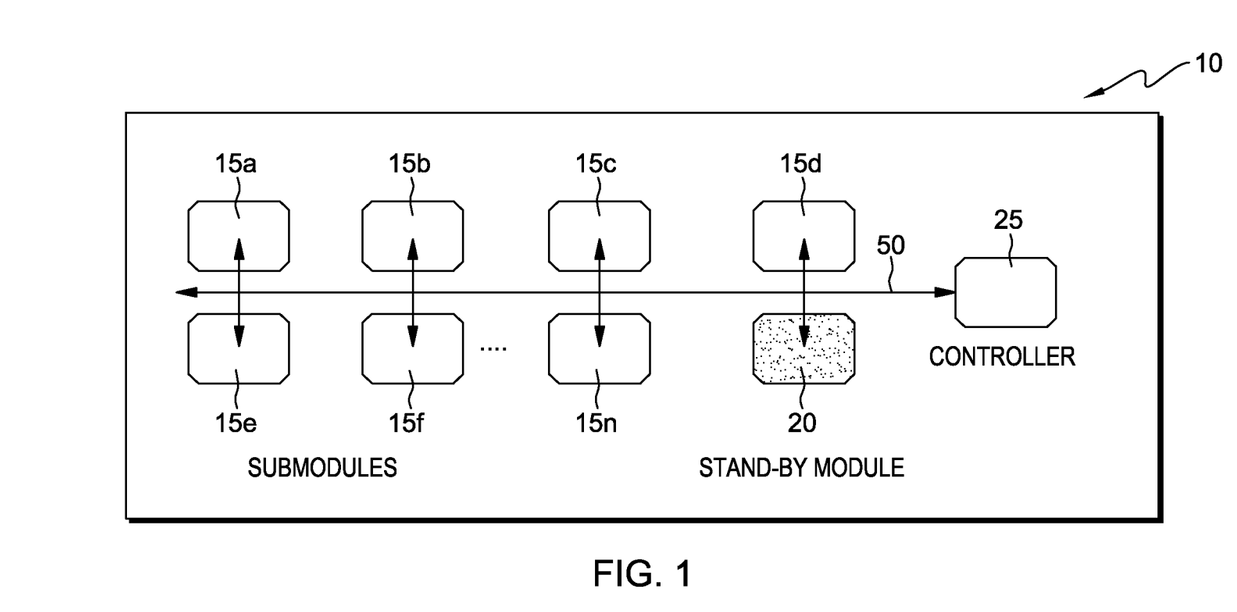
FIG. 1 depicts a dynamically adjustable PCM memory storage device having plural sub-modules in one of modes of operation and a controller.

FIG. 1 shows a dynamically adjustable memory storage module 10 configured with hardware implementing methods to dynamically adjust memory storage capacity. It is understood that the memory storage module 10 may itself be a component of a larger system, e.g., a computing system (not shown) or any device requiring memory. The memory module refers to a dynamic PCM storage module 10 which can increase its size on the fly without either shutting down the system or introducing any timing penalty. For purposes of description, a memory module structure 10 is a component which allows the storing of information into one or more locations, and allows the recalling of that information as needed. It has several attributes, the main one being capacity. The capacity is the number of locations available in the memory multiplied by the size of information that is stored in each location. As an example, a memory with a capacity of 128 MB with a word size of 4 bytes will have 32*1024 locations in which information can be stored (i.e., 1024 equals 1M).

As shown in FIG. 1, the storage apparatus or "module" 10 includes several sub-modules 15a, . . . , 15n (an individual sub-module alternatively referred to herein as "sub-module" 15) and a controller device 25. In FIG. 1, each of the sub-modules is connected via a bus 50 to the controller 25, which bus 50 may include an internal memory (e.g., data/address) bus 50 carrying control signals for configuring the module according to the methods described herein below. Controller 25 controls the bus. Each sub-module 15 includes a PCM memory component that can be configured at boot time into multiple modes of operation. One of the sub-modules 15 is a stand-by module 20. As an example, suppose the PCM sub-modules 15 are each of 1 MB capacity, and 256 such modules are used. By using one of the sub-modules as a stand-by system, the other 255 sub-modules can be configured so that the overall system has 255 MB capacity at the least, and 1020 MB in the maximum capacity mode when the sub-module is configured to operate with a capacity of 4 MB, for example. The system can switch between these modes (and a few intervening modes) dynamically without powering down the system or paying any timing penalty.

Figure 2:
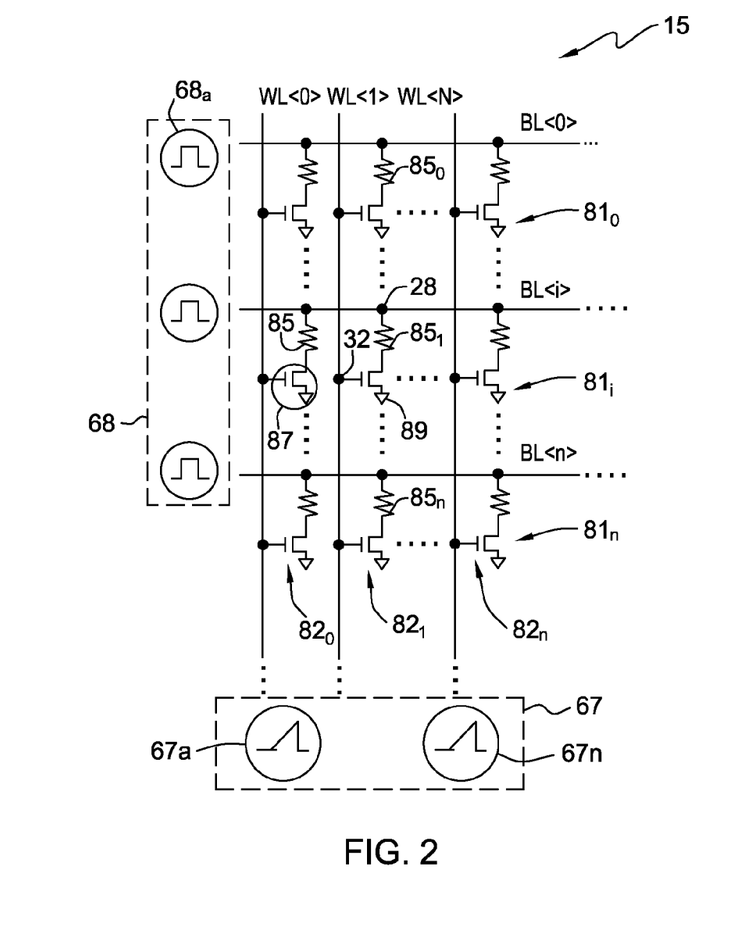
FIG. 2 shows an example memory sub-module 15 organized as an array of programmable PCM memory cell elements in one embodiment.

FIG. 2 shows an example memory sub-module 15 organized as an array 80 of programmable PCM memory cell elements formed in accordance with known PCM memory cell semiconductor manufacturing techniques. This array 80 may further be programmed in accordance with a multi-bit programming arrangement such as described in herein incorporated U.S. application Ser. No. 13/335,310 and in commonly-owned, co-pending U.S. patent application Ser. No. 13/335,155, the whole content and disclosure of which is incorporated by reference as if fully set forth herein.

As shown, formed in a semiconductor substrate, e.g., silicon, silicon-germanium or varieties of others, a plurality of structures including the PCM cell elements 85 having a formed cell access control device 87 (e.g., a transistor such as a FET/MOSFET) connected at one end using known semiconductor manufacturing lithographic masking, etching, and deposition techniques.

More particularly, in FIG. 2, the programmable PCM memory sub-module 15 including array 80 of PCM memory structures 85, in an example non-limiting implementation, is organized as "n" rows $81_0$, $81_1$, $81_n$ and "N" columns $82_0$, $82_1$, $82_N$ of memory cells. For example, each respective PCM cell structure of a respective column, e.g., structures $85_0$, $85_1$, . . . , $85_n$, is associated with a single formed electrically conductive word line, e.g., word line conductor WL<1>, and is connected at one end to the WL terminal 32 at the gate of transistor 87 for receiving control signals. Each structure $85_0$, $85_1$ . . . $85_n$ of each column is each connected at a respective row at a second terminal 28 to a respective associated electrically conductive bit line, e.g., bit lines BL(0), BL(1), . . . , BL(n) as shown in FIG. 2. Each PCM memory cell structure 85 is independently programmable; however, the each module 15 may be programmed according to a parallel programming scheme, or a plurality of multiple resistive states can be programmed at a time.

As shown in FIG. 2, each individual PCM memory cell 85 has first and second terminals, wherein the first terminals of the plurality of cells may couple to a common word line (WL) conductor (e.g., WL<0>, WL<1>, . . . , WL<N>) for example, and each of the second terminals of said plurality of cells couple to an individual bit line (BL) conductor (e.g., BL<0>, BL<1>, . . . , BL<N>) for parallel programmed access such as described in related commonly-owned, co-pending U.S. patent application Ser. Nos. 13/335,310 and 13/335,155, the whole content and disclosure of which is incorporated by reference as if fully set forth herein.

To program the array to achieve different capacities or modes, each PCM cell's first WL terminal 32 receives the WL signal input(s) at the gate of its respective access control device (transistor) 87. The transistor 87 has a drain or source terminal connected to the PCM cell and the other (source or drain) terminal connected to a system ground or neutral voltage potential 89. Further, each phase change memory cell's conductive bit line BL terminal 28 is connected at other end to receive BL signals inputs. In one non-limiting embodiment, each respective PCM cell 85 access control transistor 87 simultaneously receiving a wordline WL signal at its gate terminal 32 and BL signal at its bit line terminal is used to control the programming of PCM cell 85 by controlling current through the PCM cell 85.

As further shown in FIG. 1, the controller 25 of memory storage device 10 is responsible for directing requests made to read or write an address in the memory array to the correct sub-module 15 that contains that address. In one embodiment, the controller may be part of a very lightweight embedded control system and may be programmable, e.g., according to a policy. Thus, in one embodiment, controller 25 may include, but is not limited to: a programmed microprocessor unit having a coupled memory and providing input/output (I/O) functions for initiating self-adjusting capacity or like memory module "mode" change operations. The programmed microprocessor device may be an embedded full computing node. In one embodiment, the programmed control unit may include a programmable logic controller device (PLC) and an associated memory block, configured for controlling memory module "mode" change operations as programmed. Whether implemented as a programmed microprocessor unit or a PLC, for purposes of description, the programmed control unit is herein referred to as an embedded system controller or controller. In one embodiment, the controller 25 includes I/O functions enabling it to receive information, e.g., the aforementioned policy and instructions for carrying out the policy steps. For example, a policy computing system (not shown) provides an interface via which a human or computer enters policies for the controller 25 of memory module 10 to carry out.

The controller 25 additionally keeps track of the current usage of the memory module 10 and can determine when the sub-modules ought to be switched, for example, from operating in a low-capacity (e.g., 128 MB) mode to a high capacity (e.g., 256 MB) mode. In one embodiment, the controller makes use of the stand-by sub-module 20 to make this switch without bringing the system down or introducing additional timing penalty.

In one embodiment, as shown in FIG. 1, the memory module 10 consists of several memory sub-modules put together. The total aggregate is the memory system, and the individual memory components which make up the memory system are the sub-modules 15. As an example, a 256 MB system module can be made up of 64 sub-module each sub-module being of 4 MB. Thus, in one embodiment, the method includes aggregating several 4 MB modules into one. The "mode" in which the memory system (the aggregated whole) is referred to as the system mode—i.e. the capacity offered by the entire aggregated system. The "mode" in which each individual sub-module operates is the mode of the sub-module.

Thus, as an example, given a module 10 having 64 sub-modules 15 that are capable of running in 4 MB and 8 MB modes, when they are all in the 4 MB mode, the aggregate is in the 256 MB mode. When they are all in the 8 MB mode, the aggregate is in the 512 MB mode. By putting different sub-modules in different modes (4 MB or 8 MB), the memory system is configured with several aggregate modes between 256 MB and 512 MB, e.g. a mode with 260 MB, 264 MB etc.

The system controller 25 tracks storage module usage by measuring how much of the capacity of the (whole) system is used. The system controller is also responsible for forwarding requests for reading and writing data from the module to the right sub-module that contains the required data. In one embodiment, a specialized hardware in the memory module 10 is provided for tracking the used capacity; or alternatively, software on a computer using the memory system or module 10 keeps track of memory usage. As one example, the controller simply counts how many locations are used, or any other technique as known to skilled artisans.

Figure 3:
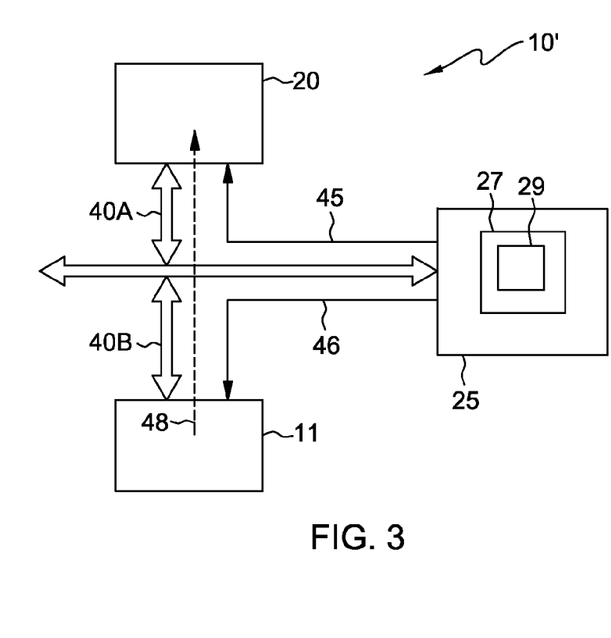
FIG. 3 shows a further detail of the memory module mode switching operations in conjunction with instructions generated by controller according to a programmed policy.

In one embodiment, as depicted in FIG. 3, effecting the change in mode (capacity) of the system (aggregate of all modules) requires use of the stand-by module 20 of FIG. 1. Referring to FIG. 3 there is depicted further detail of the memory module mode switching operations in conjunction with instructions generated by controller 25 according to a programmed policy 27 stored in an associated controller memory or cache 29. In the example memory module portion 10' shown, the stand-by sub-module 20 and selected module 11 connect with bus 50 via respective like-sized busses 40A and 40B.

Thus, for example, when all the sub-modules 15 are in 4 MB capacity, and the aggregate consists of 64 sub-modules, there are 63 sub-modules that are active and one that is stand-by. To get an extra additional 4 MB of capacity, the controller chooses one sub-module, i.e., the selected sub-module 11 as shown in FIG. 3. In one embodiment, the selected sub-module 11 may be the sub-module that is supporting the highest addressed memory locations. In another embodiment, the selected sub-module 11 may be the sub-module that is experiencing the lowest frequency of data requests. In yet another embodiment, the selected sub-module 11 may be the sub-module which is operating in the mode with a smallest capacity. The controller, e.g., acting in accordance with the policy 27, initiates turning on the power of the stand-by sub-module 20 in the changed mode, e.g., 8 MB mode. This may be effected by a controller generated power-up command or signal 45 which turns ON (or can turn OFF) the stand-by PCM sub-module 20 and its constituent device elements in the array. Then, the controller issued controls to copy the contents from the selected sub-module 11 to the stand-by module 20 (which will be half of its capacity). Arrow 48 depicts the copying of contents from selected sub-module 11 to standby sub-module 20 via bus 40A and 40B under controller operation, in the embodiment depicted in FIG. 3. It is understood that other bus configurations are possible. The other half of stand-by module 20 becomes the new capacity that is available. The selected sub-module 11 may then be powered-down. This may be effected by a controller generated power-down command or signal 46 which turns OFF (or can turn ON) the selected PCM sub-module 11 and its constituent array elements. The selected sub-module is now made into the current stand-by module, while the previously stand-by sub-module is now actively in service. It is understood that all this happens while the aggregate (memory system and module 10) is running concurrently and does not need to be powered down.

In an example method for effecting the change in mode (capacity) of the system (aggregate of all modules), one or more WL device line drivers or signal generator devices indicated as a generator device 67 (e.g., including one or more programmable clock, pulse or ramp signal generators $67a, \ldots 67n$) are provided that can simultaneously apply a WL pulse for charging one or more word lines (WL) of the PCM cells 85 to which data is being copied/programmed. Further, one or more BL drivers or signal generator devices indicated as a generator device 68 (e.g., including one or more programmable clock, pulse or ramp signal generators $68a, \ldots 68n$) are provided that can simultaneously apply the BL pulse(s) to bit lines connecting the PCM cells 85 of module 20 to which data is being copied/programmed. One WL (e.g., WL<0>) is selected and kept activated for 1 or a few cycles until all the cells connected to the same WL are written successfully. Then, WL<0> is turned off and the similar procedure is applied on WL<1>. The same procedure is repeated until sub-module copy completes. In one embodiment, a write-verify programming algorithm that governs the application of WL and corresponding application of BL pulses for multi-bit programming a plurality of cells is implemented such as described in U.S. patent application Ser. No. 13/335,310 may be implemented.

Figure 4:
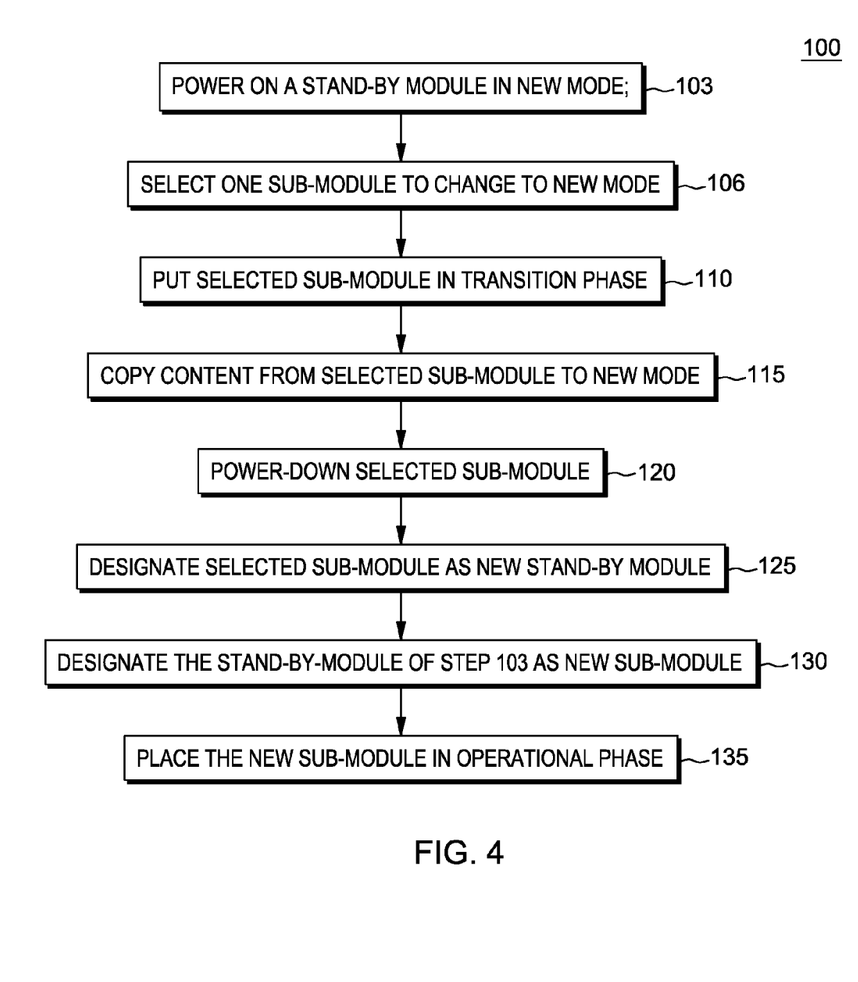
FIG. 4 shows the controller operations 100 for changing the memory storage mode by converting a selected one of the sub-modules to a different (higher or lower) capacity module.

FIG. 4 shows the controller operations 100 for changing the memory storage mode by converting a selected one of the sub-modules to the high-capacity module. In one embodiment, a triggering policy is enforced to initiate the module mode change and/or choose which mode to use for each sub-module. For example, upon determining by the controller 10 or other system device (not shown) that the current overall memory system utilization exceeds a policy threshold, e.g., 75% utilization, then a triggering policy will command the controller to increase memory capacity. It is understood that other policies for determining mode changes may be more complex than just use of thresholding. For example, the controller 25 may see a certain amount of read or write access requests coming in at an increasing rate (e.g., how fast the memory is being requested and the rate memory is being used) and a policy may indicate adjusting the memory by increasing its capacity given the rates and the current capacity or mode, e.g., 128 MB vs. 256 MB.

Thus, controller operations 100 for changing the memory storage mode in response to a policy directive responsively include, at a first step 103, powering up the stand-by module 20 in a new mode of operation. Then at 106, the controller selects one sub-module 11 to change to new mode. In one embodiment, to determine a suitable sub-module 11 to perform the switching of the sub-modules when more capacity is requested, the controller may first observe access patterns to the memory sub-modules and act according to a triggering policy as programmed therein. For example, if the powering, copying and repowering is determined as taking up some time (e.g., 2 ms), then this mode change step would be performed at least 2 ms before the system runs out of memory capacity or ideally, a reasonable time in advance. As referred to herein, a sub-module 15 is in an "operational" phase when it is working normally, and in a "transition" phase when its contents are being copied to the stand-by module 20. Thus, as indicated at 110, the selected sub-module 11 is placed in a transition phase, and at 115, information (content) from that sub-module 11 is copied to the stand-by module 20. This results in the stand-by module being placed into the mode which is desired to be operated upon. Once the data is copied, the original sub-module can now be reconfigured individually with the new mode. That is, after content is transferred from the selected sub-module 11 to the stand-by module 20, the selected sub-module is powered-down as indicated at 120. Continuing to 125, FIG. 4, the controller now designates the originally selected sub-module 11 as the new stand-by module 20, and at 130, designates the stand-by module of step 103 as the new sub-module. Finally, at 135, the new sub-module is placed in the operational phase.

The process 100 of FIG. 4 making use of the current stand-by sub-module may be repeated to convert any number of modules to a different mode.

It is understood that, during the transition phase, any memory access read operations received at the controller 25 are directed to the original sub-module 11 while writes are directed to the original and the stand-by module 20 by the controller.

Figure 5:
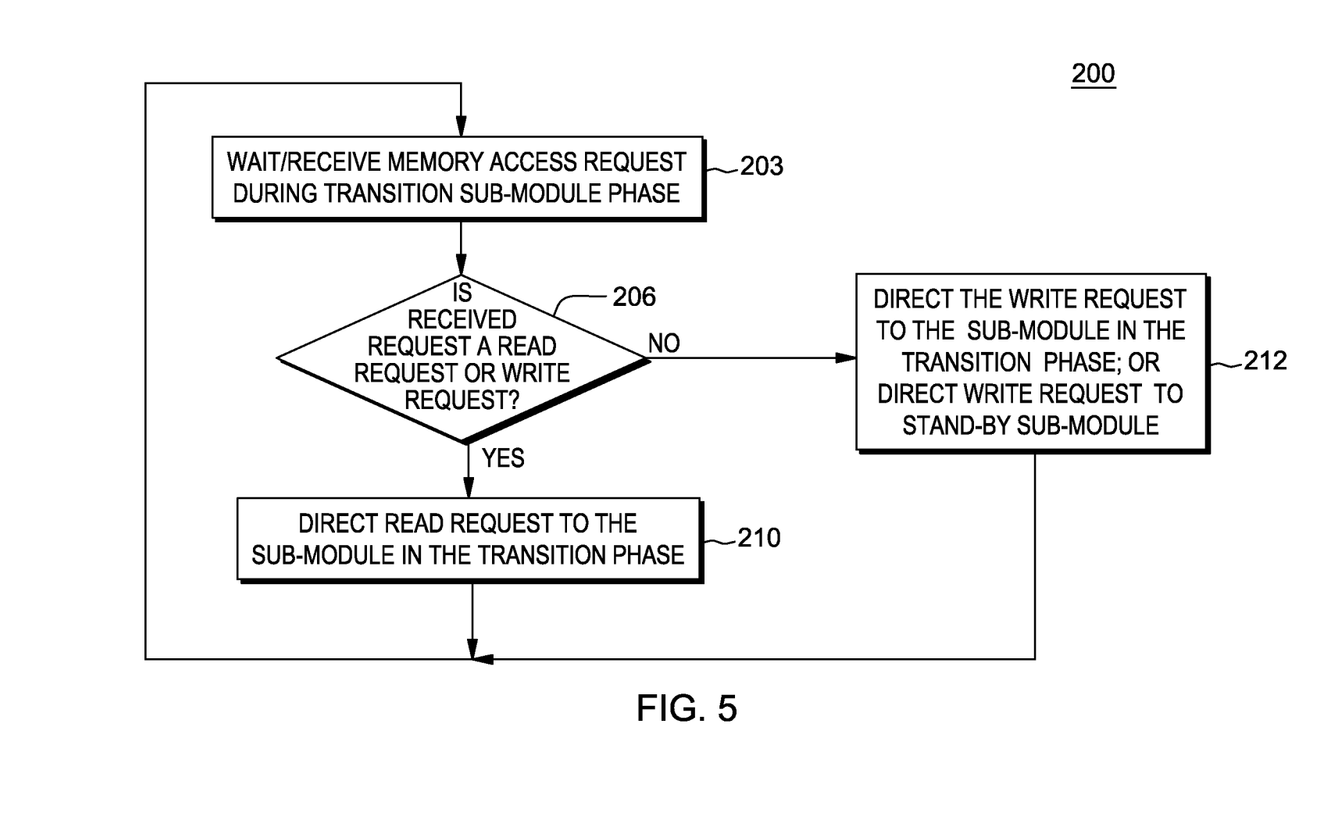
FIG. 5 is a flow-chart 200 depicting controller operations for module memory access during a copying operation.

FIG. 5 shows a flow-chart 200 depicting controller operations for module memory access during the copying whereby one of the sub-modules is in transition phase, and other is a stand-by module. At 203, FIG. 5, there is depicted a memory access request being received at module 10. In response, at 206, the controller 25 performs a check to determine if a received request is a read request or write request. If read-request (i.e., a "yes" path), then the controller directs the request to the sub-module in the transition phase at 110. Otherwise, at 206, if the request received at 203 is a write-request, then at 212, the controller directs the write request to either the sub-module in transition phase or the stand-by sub-module.

The processes described herein with respect to FIGS. 3-5 can be repeated for other sub-modules resulting in some or all the sub-modules converting to the higher mode. The same process can be used to revert back from a high capacity operation to a lower capacity operation. Thus, for example, upon determining by the controller 10 or other system device (not shown) that the current overall memory module system utilization drops below a policy threshold value, e.g., 30% utilization, then a triggering policy will command the controller to switch to a lower capacity module that decreases memory capacity.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which run via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto the controller, a computer, other programmable data processing apparatus, or other devices to cause a series of operational steps to be performed by the controller, other programmable apparatus or other devices to produce a computer implemented process such that the instructions which run on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more operable instructions for implementing the specified logical function(s). It should also be noted that, in some alternative implementations, the functions noted in the block may occur out of the order noted in the figures. For example, two blocks shown in succession may, in fact, be run substantially concurrently, or the blocks may sometimes be run in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The embodiments described above are illustrative examples and it should not be construed that the present invention is limited to these particular embodiments. Thus, various changes and modifications may be effected by one skilled in the art without departing from the spirit or scope of the invention as defined in the appended claims.

What is claimed is:

1. A method for dynamically self-adjusting a capacity of a memory storage device having a plurality of phase change memory (PCM) cells, each PCM cell comprising an adjustable-size PCM memory storage sub-module, the method comprising:
provide one of said plurality of adjustable-size PCM memory storage sub-modules in a stand-by mode of operation;
determining, based on a switching criteria, when the memory storage device needs to be switched to a different operation mode;
selecting an original actively operating adjustable-sized PCM memory storage sub-module for switching to said different operation mode, wherein the original actively operating adjustable-sized PCM memory storage sub-module is selected based upon the original actively operating adjustable-sized PCM memory storage sub-module that supports a highest addressed memory location, having a lowest frequency of data requests and operates in the mode with a smallest capacity;
copying stored data from the original selected actively operating adjustable-size PCM memory storage sub-module to said adjustable-size PCM memory storage sub-module in said stand-by mode;
designating the original selected actively operating adjustable-size PCM memory storage sub-module as a new adjustable-size PCM memory storage sub-module in a stand-by mode of operation after said copying; and
changing the capacity of the original selected actively operating adjustable-size PCM memory storage sub-module designated as the new adjustable-size PCM memory storage sub-module in the stand-by mode of operation after said copying according to said different operation mode, and
repeating said selecting, said copying stored data to said adjustable-size PCM stand-by mode sub-module, said designating and said capacity changing to convert a number of said adjustable-sized PCM memory storage sub-modules to a different mode,
wherein a programmed control device associated with said memory storage device performs said determining and selecting and initiates said copying and said capacity changing without powering down the memory storage device or paying any timing penalty.

2. The method as claimed in claim 1, wherein said determining comprises:
monitoring, by said control device, an aggregate usage of the memory storage device;
comparing aggregate usage of the memory storage device against a threshold; and
responsive to said aggregate usage of the memory storage device exceeding said threshold, said changing comprising: providing, by said control device, signals for increasing a memory storage capacity of said selected adjustable-size PCM memory storage sub-module.

3. The method as claimed in claim 1, wherein said determining comprises:
monitoring, by said control device, an aggregate usage of the memory storage device;
comparing aggregate usage of the memory storage device against a threshold; and
responsive to said aggregate usage of the memory storage device decreasing below said threshold, said changing comprising: providing, by said control device, signals for decreasing a memory storage capacity of said selected adjustable-size PCM memory storage sub-module.

4. The method as claimed in claim 1, wherein during said copying or changing, said control device receives requests to access memory of said selected actively operating adjustable-size memory storage sub-module, said method further comprising:
redirecting a read memory request to the selected adjustable-size PCM memory storage sub-module; and
redirecting a write memory request to one of: said selected adjustable-size PCM memory storage sub-module or said adjustable-size PCM memory storage sub-module in said stand-by mode of operation.

5. The method as claimed in claim 1, wherein said memory storage sub-module in said stand-by mode is powered-down, said method further comprising prior to said copying:
providing, by said control device, signals for powering on said adjustable-size PCM memory storage sub-module in said stand-by mode.

6. The method as claimed in claim 1, wherein after said copying, said method further comprises:
providing, by said control device, signals for powering down said selected adjustable-size PCM memory storage sub-module.

7. The method as claimed in claim 1, wherein said memory storage device is addressable for read/write access, said selecting one or more adjustable-size PCM memory storage sub-modules for switching to said different operation mode comprises: determining a sub-module that currently supports a plurality of highest addressed memory locations.

8. A dynamic self-adjusting memory storage system comprising:
a plurality of phase change memory (PCM) cells, each PCM cell comprising an adjustable-size PCM memory storage sub-module, at least one of said plurality of adjustable-size PCM memory storage sub-modules in a stand-by mode of operation;
a programmed control device, coupled to a memory, and communicating with said plurality of adjustable-size memory storage sub-modules over a bus, the control device configured to:
determine, based on a switching criteria, when the memory storage device needs to be switched to a different operation mode;
select an original actively operating adjustable-sized PCM memory storage sub-module for switching to said different operation mode, wherein the original actively operating adjustable-sized PCM memory storage sub-module is selected based upon the original actively operating adjustable-sized PCM memory storage sub-module that supports a highest addressed memory location, having a lowest frequency of data requests and operates in the mode with a smallest capacity;
copy stored data from the selected actively operating adjustable-size PCM memory storage sub-module to said adjustable-size PCM memory storage sub-module in said stand-by mode, the selected actively operating adjustable-size PCM memory storage sub-module rendered available in the stand-by mode of operation after said copying;

designate the original selected actively operating adjustable-size PCM memory storage sub-module as a new adjustable-size PCM memory storage sub-module in a stand-by mode of operation after said copying; and change the capacity of the selected actively operating adjustable-size PCM memory storage sub-module designated as the new adjustable-size PCM memory storage sub-module in the stand-by mode of operation after said copying according to said different operation mode; and repeat said selecting, said copying stored data to said adjustable-size PCM stand-by mode sub-module, said designating and said changing to convert a number of said adjustable-sized PCM memory storage sub-modules to a different mode without powering down the memory storage device or paying any timing penalty.

9. The memory storage system as claimed in claim 8, wherein to determine, based on a switching criteria, when the memory storage device needs changing, said control device is further configured to:

monitor an aggregate usage of the memory storage device;

compare aggregate usage of the memory storage device against a threshold; and responsive to said aggregate usage of the memory storage device exceeding said threshold, provide signals for increasing a memory storage capacity of said selected adjustable-size PCM memory storage sub-module.

10. The memory storage system as claimed in claim 8, to determine, based on a switching criteria, when the memory storage device needs changing, said control device is further configured to:

monitor an aggregate usage of the memory storage device;

compare aggregate usage of the memory storage device against a threshold; and responsive to said aggregate usage of the memory storage device decreasing below said threshold, provide signals for decreasing a memory storage capacity of said selected adjustable-size PCM memory storage sub-module.

11. The memory storage system as claimed in claim 8, wherein during said copy and change capacity steps, said control device receives requests to access memory of said selected actively operating adjustable-size PCM memory storage sub-module, said control device is further configured to:

redirect a read memory request to the selected adjustable-size PCM memory storage sub-module; and redirect a write memory request to one of: said selected adjustable-size PCM memory storage sub-module or said adjustable-size PCM memory storage sub-module in said stand-by mode of operation.

12. The memory storage system as claimed in claim 8, wherein said memory storage sub-module in said stand-by mode is powered-down, said control device is further configured to:

prior to the copy, provide signals for powering on said adjustable-size PCM memory storage sub-module in said stand-by mode.

13. The memory storage system as claimed in claim 8, wherein after the copy step, said control device is further configured to:

provide signals for powering down said selected adjustable-size memory storage sub-module.

14. The memory storage system as claimed in claim 8, wherein said memory storage device is addressable for read/write access and to select one or more adjustable-size memory storage sub-modules for switching to said different operation mode, said control device is further configured to determine a sub-module that currently supports a plurality of highest addressed memory locations.

* * * * *